(12) United States Patent
Fu et al.

(10) Patent No.: US 9,012,942 B2
(45) Date of Patent: Apr. 21, 2015

(54) LIGHT-EMITTING DEVICE HAVING PATTERNED INTERFACE AND THE MANUFACTURING METHOD THEREOF

(71) Applicant: Epistar Corporation, Hsinchu (TW)

(72) Inventors: Jenn-Hwa Fu, Hsinchu (TW);
Cheng-Hsien Li, Hsinchu (TW);
Chi-Hao Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 4 days.

(21) Appl. No.: 13/903,169

(22) Filed: May 28, 2013

(65) Prior Publication Data
US 2013/0313596 A1    Nov. 28, 2013

(30) Foreign Application Priority Data
May 28, 2012   (TW) .............................. 101119052 A

(51) Int. Cl.
*H01L 33/00* (2010.01)
*H01L 33/22* (2010.01)

(52) U.S. Cl.
CPC ......... *H01L 33/22* (2013.01); *H01L 2933/0091* (2013.01)

(58) Field of Classification Search
CPC ..................... H01L 21/76229; H01L 33/0025;
H01L 33/16; H01L 21/02458; H01L 21/0254;
H01L 21/76898; H01L 29/78681; H01L
29/78684; H01L 31/072; H01L 31/1804;
H01L 33/0029; H01L 33/0062; H01L
33/0083; H01L 51/5284; H01S 5/2206;
H01S 5/32; H01S 5/3216

USPC .............................. 257/13, 40, 79–103, 918,
257/E29.069–E29.071, E29.245,
257/E49.001–E49.004, E21.404, 642–643,
257/759, E51.001–E51.052,
257/E25.008–E25.009, 116, 117, 432–437,
257/E33.056–E33.059, E25.032;
438/22–47, 69, 496, 503, 82, 99, 493,
438/507, 956

See application file for complete search history.

(56) References Cited

U.S. PATENT DOCUMENTS

| | | | | |
|---|---|---|---|---|
| 8,592,800 | B2 * | 11/2013 | Moustakas et al. | 257/13 |
| 2006/0286697 | A1 * | 12/2006 | Leem | 438/27 |
| 2008/0117519 | A1 * | 5/2008 | Chari et al. | 359/619 |
| 2012/0193664 | A1 * | 8/2012 | Lin | 257/98 |

\* cited by examiner

*Primary Examiner* — Dao H Nguyen
*Assistant Examiner* — Tram H Nguyen
(74) *Attorney, Agent, or Firm* — Patterson & Sheridan, LLP

(57) ABSTRACT

The present disclosure provides a light-emitting device having a patterned interface composed of a plurality of predetermined patterned structures mutually distinct, wherein the plurality of predetermined patterned structures are repeatedly arranged in the patterned interface such that any two neighboring patterned structures are different from each other. The present disclosure also provides a manufacturing method of the light-emitting device. The method comprises the steps of providing a substrate, generating a random pattern arrangement by a computing simulation, forming a mask having the random pattern arrangement on the substrate, and removing a portion of the substrate thereby transferring the random pattern arrangement to the substrate.

17 Claims, 9 Drawing Sheets

LIGHT-EMITTING DEVICE HAVING PATTERNED INTERFACE AND THE MANUFACTURING METHOD THEREOF

REFERENCE TO RELATED APPLICATION

This application claims the right of priority based on TW Application Serial No. 101119052, filed May 28, 2012, and the content of which is hereby incorporated by reference in its entirety.

TECHNICAL FIELD

This present application relates to a light-emitting device having a patterned interface.

BACKGROUND OF THE DISCLOSURE

In recent years, efforts have been devoted to improve the luminance of the LED in order to apply the device to the lighting domain, and further achieve the goal of energy conservation and carbon reduction. The enhancement of the luminance relies on improvement of internal quantum efficiency (IQE) by improving the quality of epitaxy layers to increase the recombination rate of electrons and holes. Another way is to improve the light extraction efficiency (LEE) by effectively guiding light emitted by light-emitting layer out of the device and lowering the amount of light internally absorbed by the structure of the light-emitting device.

Surface roughness technology serves as one of the effective ways to improve luminance. A well-known method of surface roughing is mechanically polishing the surface of the substrate to form randomly distributed rough surface which is difficult for controlling the roughness such as depth or width effectively so reproducibility is worse. Besides, it is hard to control quality of epitaxy layers and more likely to cause epitaxy layers of poor quality forming epitaxy layers on the un-uniform surface when applying the method on mass production.

SUMMARY OF THE DISCLOSURE

The present disclosure provides a light emitting device having a patterned interface composed of a plurality of pre-determined patterned structures different from each other, wherein the plurality of mutually distinct predetermined patterned structures are repeatedly arranged in the patterned interface such that any two neighboring patterned structures are different from each other. In one embodiment, the patterned interface comprises a plurality of first areas and second areas staggered wherein the plurality of predetermined patterned structures different from each other are arranged in different ways within the plurality of first areas and/or the second areas. In another embodiment, the light emitting device further comprises a substrate and an epitaxy layer stack wherein the patterned interface is formed between the substrate and the epitaxy layer stack or formed on a surface of the epitaxy layer stack distant from the substrate.

The other aspect of the present disclosure provides a manufacturing method of the light-emitting comprises steps of providing a substrate, generating a random pattern arrangement according to a simulation, forming a mask having the random pattern arranged on the substrate, and removing a portion of the substrate thus the surface of the substrate comprises the random pattern arrangement on it. In an embodiment, the simulation comprises Monte Carlo simulation.

DETAILED DESCRIPTION OF THE PREFERRED EMBODIMENTS

Figure 1:
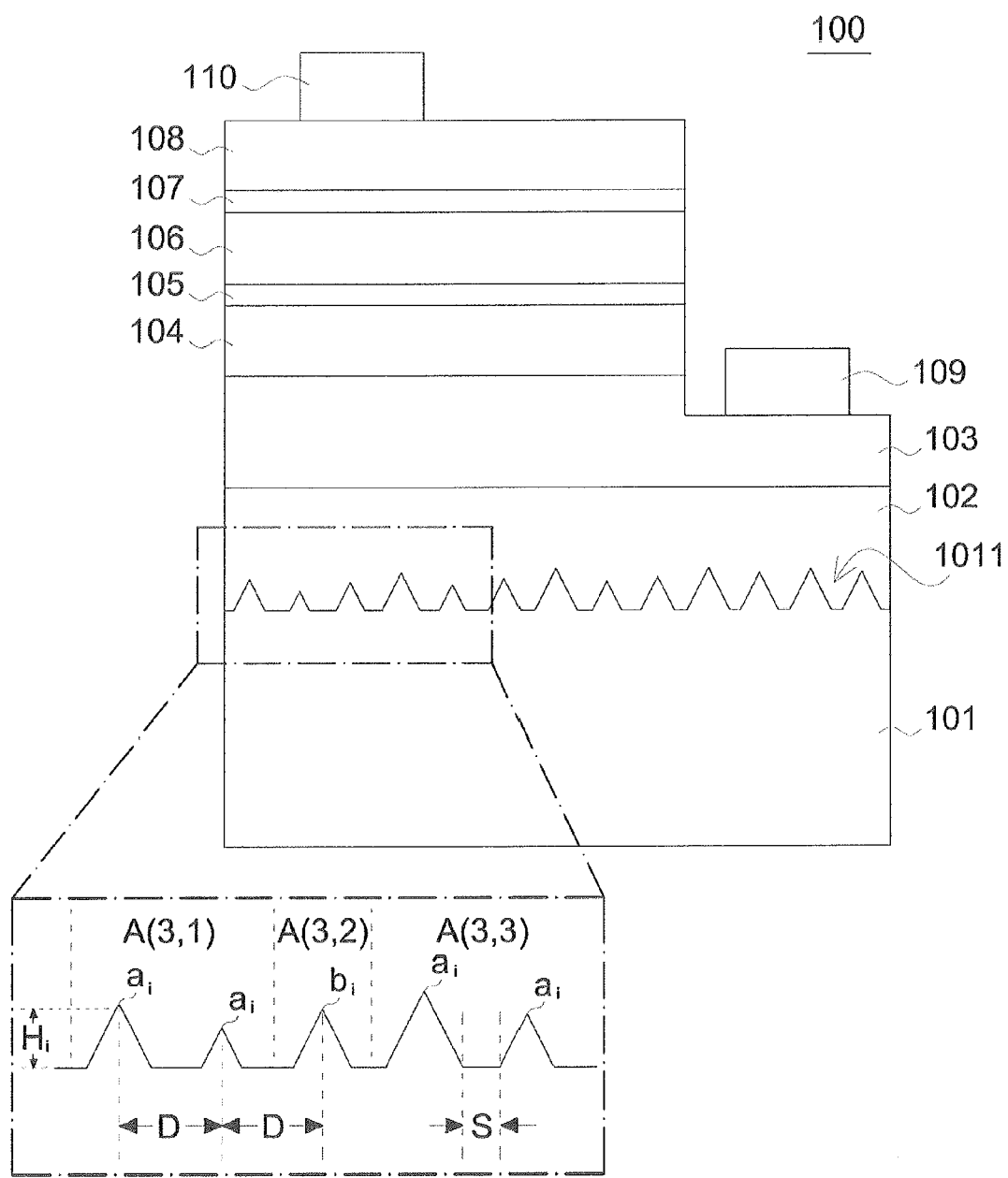
FIG. 1 shows a cross-sectional view of the light emitting device in accordance with an embodiment of the present disclosure.

FIG. 1 shows a light emitting device 100 in accordance with the present disclosure comprising a growth substrate 101, an un-doped semiconductor layer 102 epitaxially formed on the growth substrate 101, a first contact layer 103 doped with a first impurity formed on the un-doped semiconductor layer 102, a first cladding layer 104 doped with the first impurity formed on the first contact layer 103, an active layer 105 epitaxially grown on the first cladding layer 104 wherein the active layer 105 can be driven to emit a light having a first dominant wavelength, a second cladding layer 106 epitaxially formed on the active layer 105, a second contact layer 107 doped with a second impurity epitaxially grown on the second cladding layer 106, a current spreading layer 108 formed on the second contact layer 107 and form an Ohmic contact with the second contact layer 107, a first electrode 109 formed on the exposed first contact layer 103 by evaporation or sputtering, and a second electrode 110 formed on the current spreading layer 108 by evaporation or sputtering. In the embodiment, the growth substrate 101 and the epitaxy layer stack are single-crystalline structures wherein the epitaxy layer stack comprises first cladding layer 104, first contact layer 103, active layer 105, second cladding layer 106, a second contact layer 107, and the current spreading layer 108.

The patterned interface 1011 locates between the growth substrate 101 and the un-doped semiconductor layer 102. The patterned interface 1011 is composed of predetermined patterned structures having a predetermined amount n wherein the predetermined patterned structures are different from each other. The predetermined patterned structures in the patterned interface 1011 can be cones or pyramidal and have a predetermined number n. The predetermined number n is ranged from 10 to 100, or preferably ranged from 10 to 50. In this embodiment, the predetermined patterned structures protruded on the growth substrate 101 are different from each other wherein the plurality of the patterned structures can be separated into a first group and a second group. The patterned structure $a_i$ refers to the patterned structures of the first group and the patterned structure bi refers to the patterned structures of the second group. Any two patterned structures $a_i$ of the first group have at least one different characteristic like size, shape, spacing or other structure characteristics. Similarly, any two patterned structures $b_i$ of the second group have at least one different characteristic like size, shape, spacing or other structure characteristics. Moreover, any patterned structure selected from the first group has at least one characteristic differs from that of any patterned structure selected from the second group like size, shape, spacing or other structure characteristics. Multiple pattern structures $a_i$ of the first group and multiple pattern structures $b_i$ of the second group are repeatedly distributed on different or non-overlapped areas of the patterned interface 1011. The feature sizes of the pattern structures are between 0.5 μm to 10 μm. The feature size in present disclosure refers to the longest distance between any two points on the periphery of a pattern structure. For example, the feature size of a circle refers to its diameter; the feature size of a rectangle refers to its diagonal. The embodiments of the patterned interface are described in detail as below.

Figure 2A:
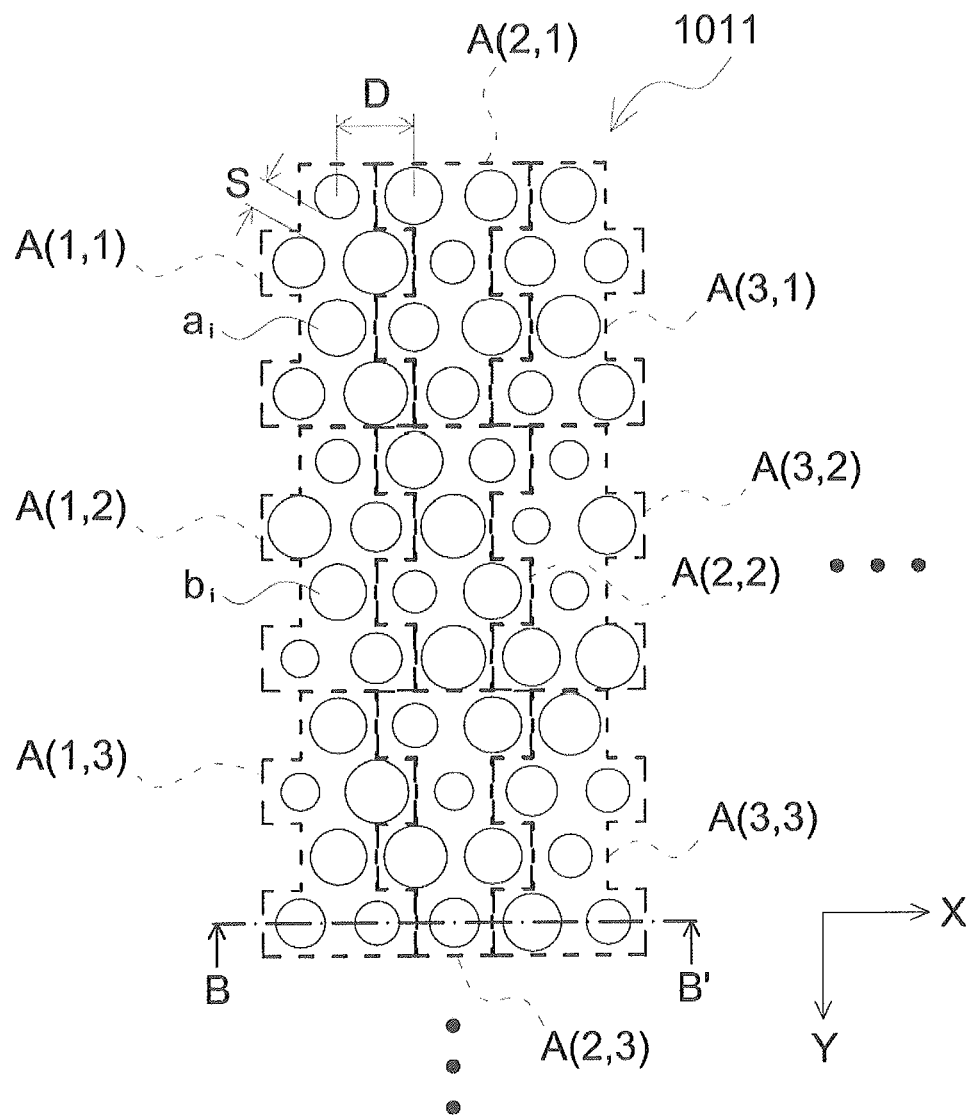
FIGS. 2A-2E show shapes in accordance with the top views of the first to the fifth embodiments of the present disclosure.

FIG. 2A further discloses a first embodiment of the patterned interface 1011 in FIG. 1 comprising a plurality of patterned sections arranged in an array wherein the location of each patterned section is defined as A(x,y), 1≤x≤m, 1≤y≤n wherein x and y correspondingly represent the value of coordinate in horizontal and in vertical direction; the x, y, m, and n are positive integers while m and n are determined by the chip size of the light emitting device. When the sum of x and y in a section A(x,y) is even, such as sections A(1,1), A(1,3), A(2,2), A(3,1), and A(3,3), the section comprises a plurality of pattern structures $a_i$ of the first group. When the sum of x and y in a section A(x,y) is odd, such as sections A(2,1), A(1,2), A(2,3), and A(3,2), the section comprises a plurality of pattern structures $b_i$ of the second group. Thus, sections comprising multiple pattern structures $a_i$ of the first group and sections comprising multiple pattern structures $b_i$ of the second group are spaced apart from each other and/or abutted against each other so any two neighboring patterned structures on the patterned interface 1011 have at least one different characteristic like size, shape, spacing, or other structure characteristics. In this embodiment, A (1, 1) comprises six patterned structures $a_1$~$a_6$ of circle top view with different diameters wherein the distance D between two geometric centers of two neighboring patterned structures is about 1~10 μm, and the closest spacing S between two neighboring patterned structures is not less than 0.1 μm and preferably between 0.1~5 μm. A (2, 1) also comprises six patterned structures $b_1$~$b_6$ of circle top view with different diameters wherein a distance D is between two geometric centers of two neighboring patterned structures, and the closest spacing between the periphery of the two neighboring patterned structures is not less than 0.1 μm and preferably between 0.1~5 μm. Moreover, the feature sizes (diameter) $r_1$~$r_6$ of patterned structures $a_1$~$a_6$ satisfy the below equation:

$$r_i = r_m + (2i-2) * \frac{(r_M - r_m)}{2n-1}, i = 1 \sim n;$$

diameters $R_1$~$R_6$ of $b_1$~$b_6$ also satisfy the below equation:

$$R_i = r_m + (2i-1) * \frac{(r_M - r_m)}{2n-1}, i = 1 \sim n;$$

wherein the $r_m$ and $r_M$ respectively represent the smallest diameter and the largest diameter of patterned structures $a_1$~$a_6$ and patterned structures $b_1$~$b_6$. The 2n represents the total number of the patterned structures $a_1$~$a_6$ and $b_1$~$b_6$, which equals to twelve in this embodiment, i.e. 2n=12. For example, when $r_m$ and $r_M$ are 1.9 μm and 3.0 μm, $r_1$~$r_6$ are 1.9, 2.1, 2.3, 2.5, 2.7, 2.9 μm wherein $r_1$=$r_m$ and a distance between any two neighboring patterned structures is an integer multiple of a predetermined value; $R_1$~$R_6$ are 2.0, 2.2, 2.4, 2.6, 2.8, 3.0 μm wherein $R_6$=$r_M$ and a distance between any two neighboring patterned structures is an integer multiple of a predetermined value.

In this embodiment, any one of the sections A(x,y) satisfying a sum of x and y is even comprises a plurality of pattern structures $a_1$~$a_6$ of the first group. However, the arrangements of the pattern structures $a_1$~$a_6$ in these sections are different such as the pattern structures having same diameter locate at different relative positions in different sections. In this embodiment, arrangements of pattern structures $a_1$~$a_6$ in sections A(1,1), A(1,3), A(2,2) and A(3,1) are different, which means at least one same pattern structure in any two above sections locates at different relative positions in each section. To be more specific, the amount of the sections satisfying a sum of x and y is even is less than the factorial of 6 (6!) which equals to 720. By a well-known method of random calculation, such as Monte-Carlo Simulation, the pattern structures $a_1$~$a_6$ can be arranged variously in sections. Similarly, when section A(x,y) has an odd sum of x and y, it comprises a plurality of pattern structures $b_1$~$b_6$ of the second group arranged variously in different sections. For example, same pattern structures locate at different relative positions in different sections. In this embodiment, arrangements of pattern structures $b_1$~$b_6$ in sections A(2,1), A(1,2), A(2,3), and A(3,2) are different, which means at least one same pattern structure in two of the aforementioned sections locates at different relative positions in each section. By a well-known method of random calculation, such as Monte-Carlo Simulation, the sections can be arranged variously. To be more specific, the amount of the sections satisfying a sum of x and y is odd is less than the factorial of 6 (6!), which equals to 720. Although the patterned interface 1011 has limited, predetermined, and different pattern structures repeatedly arranged in different sections as disclosed in the embodiment, at least one different characteristic can be found in any two neighboring pattern structures on the patterned interface 1011. Compared with pattern structure of one cycle, the efficiency of light extraction in the embodiment disclosed above is improved because the light emitted from the active layer 105 is uniformly spread to the patterned interface 1011.

Figure 2B:
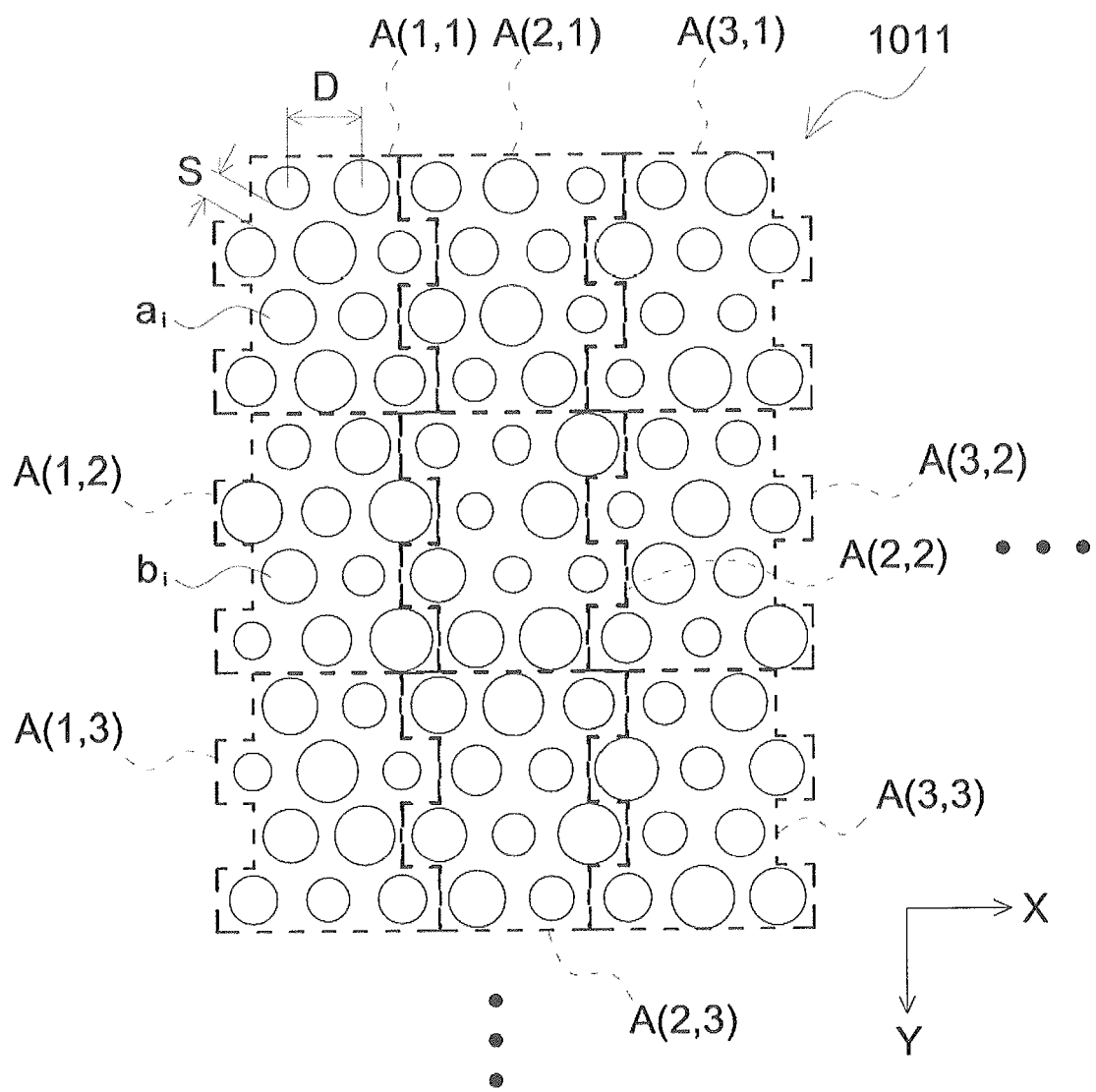

FIG. 2B further disclose a second embodiment of the patterned interface 1011 in FIG. 1 comprising a plurality of patterned sections arranged in an array wherein the location of each patterned section is defined as A(x,y), 1≤x≤m, 1≤y≤n wherein x and y are correspondingly represent the value of coordinate in horizontal and in vertical direction. The x,y,m, and n are positive integers wherein m and n are determined by the chip size of the light emitting device. When the sum of x and y in a section A(x,y) is even, such as sections A(1,1), A(1,3), A(2,2), A(3,1), and A(3,3), the section A(x,y) comprises a plurality of pattern structures $a_i$ of the first group. When the sum of x and y in a section A(x,y) is odd, such as sections A(2,1), A(1,2), A(2,3) and A(3,2), the section A(x,y) comprises a plurality of pattern structures $b_i$ of the second group. Thus, sections comprising multiple pattern structures of first group and sections comprise multiple pattern structures of second group are spaced apart from each other and/or abutted against each other so any two neighboring patterned structures on the patterned interface 1011 have at least one different characteristic like size, shape, spacing, or other structure characteristics. To be more specific, section A (1, 1) comprises ten patterned structures $a_1$~$a_{10}$ of circle top view with different diameters wherein the distance D between two geometric centers of two neighboring patterned structures is about 1~10 μm. The closest spacing of the periphery between two neighboring patterned structures is not less than 0.1 μm and preferably between 0.1~5 μm. Section A (2, 1) also comprises ten patterned structures $b_1 \sim b_{10}$ of circle shape but different diameter wherein a distance D is between two geometric centers of two neighboring patterned structures and the closest spacing of the periphery between two neighboring patterned structures is not less than 0.1 μm and preferably between 0.1~5 μm. Moreover, the feature sizes (diameter) $r_1 \sim r_{10}$ of patterned structures $a_1 \sim a_{10}$ satisfy the below equation:

$$r_i = r_m + (2i-2) * \frac{(r_M - r_m)}{2n-1}, i = 1 \sim n;$$

diameters of $b_1 \sim b_{10}$, which are also represented as $R_1 \sim R_{10}$ satisfy the below equation:

$$R_i = r_m + (2i-1) * \frac{(r_M - r_m)}{2n-1}, i = 1 \sim n;$$

The $r_m$ and $r_M$ respectively represent the smallest diameter and the largest diameter of patterned structures $a_1 \sim a_{10}$ and patterned structures $b_1 \sim b_{10}$. The 2n represents the total number of the patterned structures $a_1 \sim a_{10}$ and $b_1 \sim b_{10}$, which equals to twenty in this embodiment, i.e. 2n=20. For example, when $r_m$ and $r_M$ are 1.9 μm and 3.8 μm, $r_1 \sim r_{10}$ are 1.9, 2.1, 2.3, ..., 3.5, 3.7 μm wherein $r_1 = r_m$ and a distance between any two neighboring patterned structures is an integer multiple of a predetermined value; $R_1 \sim R_{10}$ are 2.0, 2.2, 2.4 ..., 3.6, 3.8 μm wherein $R_5 = r_M$ and a distance between any two neighboring patterned structures is an integer multiple of a predetermined value.

In this embodiment, any one of the sections A(x,y) satisfying a sum of x and y is even comprises a plurality of pattern structures $a_1 \sim a_{10}$ of the first group. However, the arrangements of the pattern structures $a_1 \sim a_{10}$ in these sections are different from each other, such as same pattern structures locate at different relative positions in different sections. In this embodiment, arrangement of pattern structures $a_1 \sim a_{10}$ in sections A(1,1), A(1,3), A(2,2) and A(3,1) are different, which means at least one same pattern structure in any two of the aforementioned sections locates at different relative positions in the two sections. To be more specific, the amount of the sections satisfying a sum of x and y is even is less than the factorial of 10 (10!). By a well-known method of random calculation such as Monte-Carlo Simulation, the pattern structures can be arranged variously in sections. Similarly, when section A(x,y) has an odd sum of x and y, it comprises a plurality of pattern structures $b_1 \sim b_{10}$ of the second group arranged variously in different sections. In this embodiment, arrangements of pattern structures $b_1 \sim b_{10}$ are different in sections A(2,1), A(1,2), A(2,3) and A(3,2) which means at least one same pattern structure in any two above sections locates at different relative positions in each section. The arrangements can be realized by a well-known method of random calculation, such as Monte-Carlo Simulation to arrange pattern structures in different arrangements in sections. To be more specific, the amount of the sections satisfying a sum of x and y is odd is less than the factorial of 10 (10!). Thus the arrangements of the sections are different from each other. Although the patterned interface 1011 has limited, predetermined, and different pattern structures repeatedly arranged in different sections as disclosed in the embodiment, at least one different characteristic can be found in any two neighboring pattern structures on the patterned interface 1011. Compared with pattern structure of one cycle, the efficiency of light extraction in the embodiment disclosed above is improved because the light emitted from the active layer 105 is uniformly spread to the patterned interface 1011.

Figure 2C:
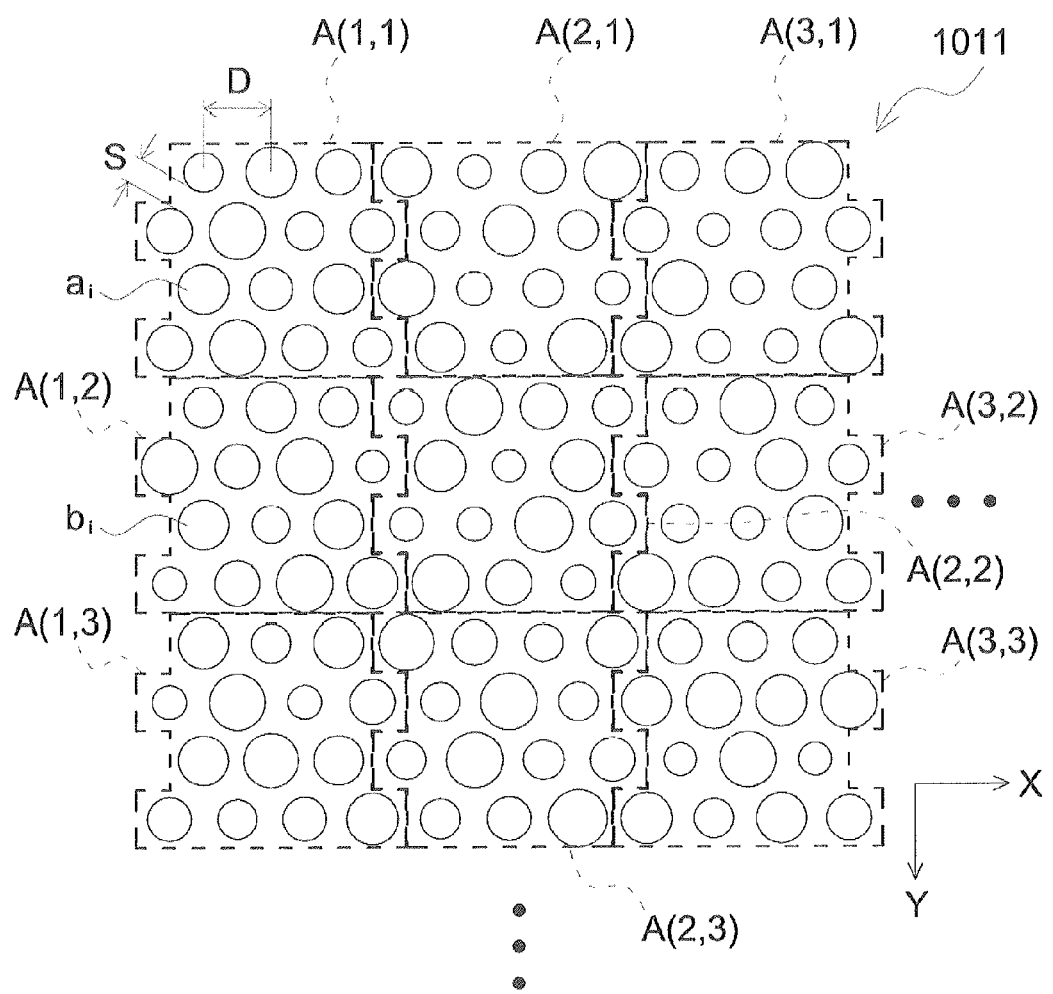

FIG. 2C further disclose a third embodiment of the patterned interface 1011 in FIG. 1, comprising a plurality of patterned sections arranged in an array wherein the location of each patterned section is defined as A(x,y), 1≤x≤m, 1≤y≤n wherein x and y are correspondingly represent the value of coordinate in horizontal and in vertical direction. The x,y,m, and n are positive integers while m and n are determined by the chip size of the light emitting device. A section A(x,y) having an even sum of x and y, such as sections A(1,1), A(1,3), A(2,2), A(3,1), and A(3,3) comprises a plurality of pattern structures $a_i$ of the first group. A section A(x,y) having an odd sum of x and y, such as A(2,1), A(1,2), A(2,3), and A(3,2) comprises a plurality of pattern structures $b_i$ of the second group. Thus, sections comprising multiple pattern structures $a_i$ of the first group and sections comprising multiple pattern structures $b_i$ of the second group are spaced apart from each other and/or abutted against each other so any two neighboring patterned structures on the patterned interface 1011 have at least one different characteristic not limited to size, shape, spacing, or other structure characteristics. To be more specific, A(1, 1) comprises fourteen patterned structures $a_1 \sim a_{14}$ of circle top view with different diameters. The distance D between two geometric centers of two neighboring patterned structures is about 1~10 μm, and the closest spacing of the periphery between two neighboring patterned structures is not less than 0.1 μm and preferably between 0.1~5 μm. A (2, 1) also comprises fourteen patterned structures $b_1 \sim b_{14}$ of circle shape but different diameter wherein a distance D is between two geometric centers of two neighboring patterned structures and the closest spacing of the periphery between two neighboring patterned structures is not less than 0.1 μm and preferably between 0.1~5 μm. The feature sizes (diameter) $r_1 \sim r_{14}$ of $a_1 \sim a_{14}$ satisfy the below equation:

$$r_i = r_m + (2i-2) * \frac{(r_M - r_m)}{2n-1}, i = 1 \sim n;$$

diameters of $b_1 \sim b_{14}$, which are also represented as $R_1 \sim R_{14}$ satisfy the below equation:

$$R_i = r_m + (2i-1) * \frac{(r_M - r_m)}{2n-1}, i = 1 \sim n;$$

wherein the $r_m$ and $r_M$ respectively represent the smallest diameter and the largest diameter of patterned structures $a_1 \sim a_{14}$ and patterned structures $b_1 \sim b_{14}$. The 2n represents the total number of the patterned structures $a_1 \sim a_{14}$ and $b_1 \sim b_{14}$, which equals to twenty-eight in this embodiment, i.e. 2n=28. For example, when $r_m$ and $r_M$ are 1.0 μm and 3.7 μm, $r_1 \sim r_{14}$ are 1.0, 1.2, 1.4, ..., 3.4, 3.6 μm wherein $r_1 = r_m$ and the shortest distance between periphery of two neighboring patterned structures is an integer multiple of a predetermined value; $R_1 \sim R_{14}$ are 1.1, 1.3, 1.5 ..., 3.5, 3.7 μm wherein $R_5 = r_M$ and the shortest distance between periphery of two neighboring patterned structures is an integer multiple of a predetermined value.

In this embodiment, any one of the sections A(x,y) where a sum of x and y is even comprises a plurality of pattern structures $a_1 \sim a_{14}$ of the first group. However, the arrangements of the pattern structures $a_1 \sim a_{14}$ in these sections are different from each other and the same pattern structures locate at different relative positions in different sections. In this embodiment, arrangements of pattern structures $a_1$~$a_{14}$ in sections A(1,1), A(1,3), A(2,2) and A(3,1) are different, which means at least one same structure locates at different relative positions in two of the aforementioned sections. To be more specific, the amount of the sections satisfying a sum of x and y is even is less than the factorial of 14 (14!). Thus, the arrangements of the sections are different from each other. By a well-known method of random calculation, such as Monte-Carlo Simulation, the pattern structures can be arranged variously in sections. Similarly, when section A(x,y) has an odd sum of x and y, it comprises a plurality of pattern structures $b_1$~$b_{14}$ of second group arranged variously. However, the arrangements of the pattern structures $b_1$~$b_{14}$ in these sections are different such that same pattern structures locate at different relative positions in different sections. In this embodiment, arrangements of pattern structures $b_1$~$b_{14}$ are different in sections A(2,1), A(1,2), A(2,3) and A(3,2) which means at least one same pattern structure in any two of the aforementioned sections locates at different relative positions in two sections. By a well-known method of random calculation, such as Monte-Carlo Simulation, the pattern structures can be arranged to be different from each other. To be more specific, the amount of the sections satisfying a sum of x and y is odd is less than the factorial of 14 (14!). Thus, the arrangements of the sections are different from each other. Although the patterned interface 1011 has limited, predetermined, and different pattern structures repeatedly arranged in different sections as disclosed in the embodiment, at least one different characteristic can be found in any two neighboring pattern structures on the patterned interface 1011. Compared with pattern structure of one cycle, the efficiency of light extraction in the embodiment disclosed above is improved because the light emitted from the active layer 105 is uniformly spread to the patterned interface 1011.

Figure 2D:
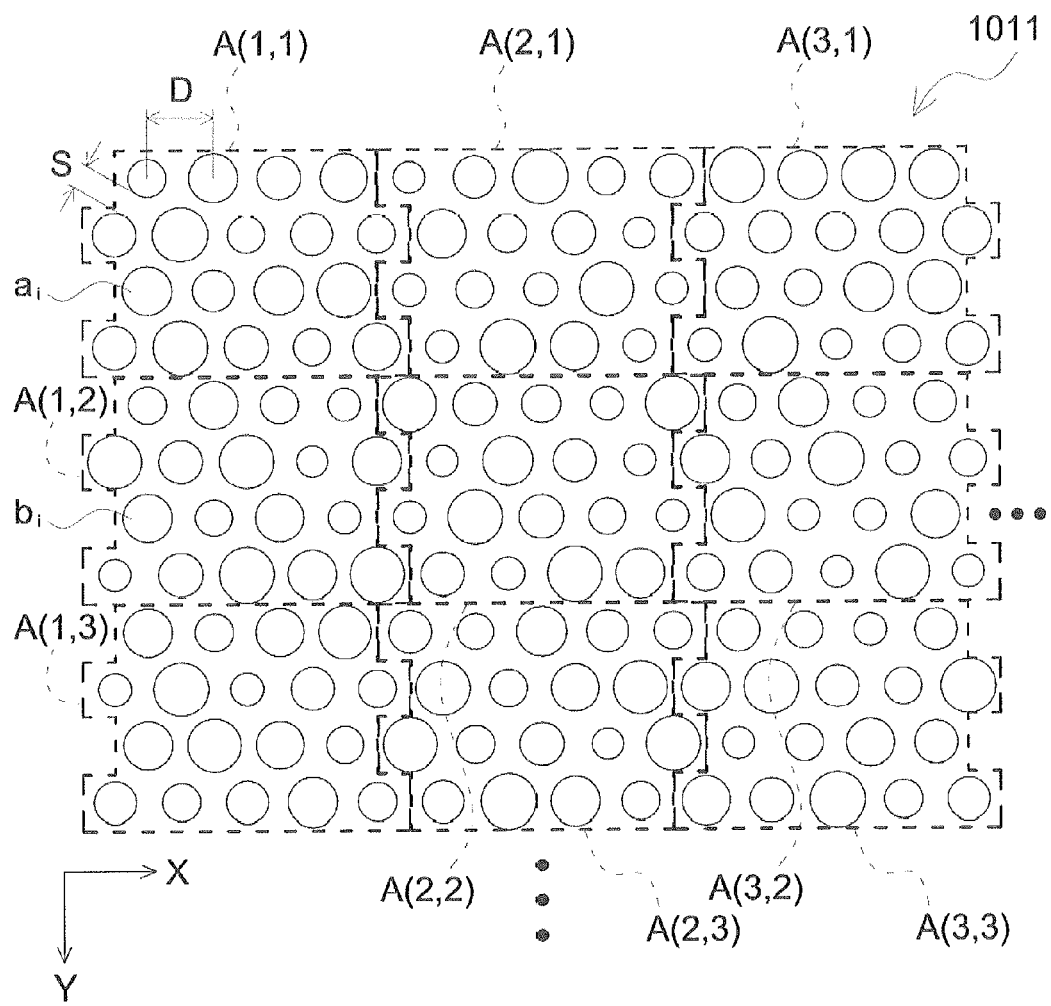

FIG. 2D further disclose a fourth embodiment of the patterned interface 1011 in FIG. 1 comprising a plurality of patterned sections arranged in an array wherein the location of each patterned section is defined as A(x,y), $1 \leq x \leq m$, $1 \leq y \leq n$ wherein x and y are correspondingly represent the value of coordinate in horizontal and in vertical direction. The x,y,m, and n are positive integers while m and n are determined by the chip size of the light emitting device. A section A(x,y) having an even sum of x and y, such as sections A(1,1), A(1,3), A(2,2), A(3,1), and A(3,3) comprises a plurality of pattern structures $a_i$ of the first group. A(x,y) having an odd sum of x and y, such as A(2,1), A(1,2), A(2,3), and A(3,2) comprises a plurality of pattern structures $b_i$ of the second group. Thus, sections comprising multiple pattern structures $a_i$ of the first group and sections comprising multiple pattern structures $b_i$ of the second group are spaced apart from each other and/or abutted against each other so any two neighboring patterned structures on the patterned interface 1011 have at least one different characteristic like size, shape, spacing, or other structure characteristics. To be more specific, A (1, 1) comprises eighteen patterned structures $a_1$~$a_{18}$ of circle top view with different diameters. The distance D between two geometric centers of two neighboring patterned structures is about 1~10 μm, and the closest spacing of the periphery between two neighboring patterned structures is not less than 0.1 μm and preferably between 0.1~5 μm. A (2, 1) also comprises eighteen patterned structures $b_1$~$b_{18}$ of circle shape but different diameter wherein a distance D is between two geometric centers of two neighboring patterned structures and the closest spacing of the periphery between two neighboring patterned structures is not less than 0.1 μm and preferably between 0.1~5 μm. The feature sizes (diameter) $r_1$~$r_{18}$ of $a_1$~$a_{18}$ satisfy the below equation:

$$r_i = r_m + (2i - 2) * \frac{(r_M - r_m)}{2n - 1}, i = 1 \sim n;$$

diameters of $b_1$~$b_{18}$, which are also represented as $R_1$~$R_{18}$ satisfy the below equation:

$$R_i = r_m + (2i - 1) * \frac{(r_M - r_m)}{2n - 1}, i = 1 \sim n;$$

wherein the $r_m$ and $r_M$ respectively represent the smallest diameter and the largest diameter of patterned structures $a_1$~$a_{18}$ and patterned structures $b_1$~$b_{18}$. The 2n represents the total number of the patterned structures $a_1$~$a_{18}$ and $b_1$~$b_{18}$, which equals to thirty-six in this embodiment, i.e. 2n=36. For example, when $r_m$ and $r_M$ are 1.0 μm and 4.5 μm, $r_1$~$r_{18}$ are 1.0, 1.2, 1.4, . . . , 4.2, 4.4 μm wherein $r_1 = r_m$ and the shortest distance between periphery of two neighboring patterned structures is an integer multiple of a predetermined value; $R_1$~$R_{18}$ are 1.1, 1.3, 1.5 . . . , 4.3, 4.5 μm such that $R_5 = r_M$ and the shortest distance between periphery of two neighboring patterned structures is an integer multiple of a predetermined value.

In this embodiment, any one of the sections A(x,y) satisfying a sum of x and y is even comprises a plurality of pattern structures $a_1$~$a_{18}$ of the first group. However, the arrangements of the pattern structures $a_1$~$a_{18}$ in these sections are different from each other such that the same pattern structures locate at different relative positions in different sections. In this embodiment, arrangements of pattern structures $a_1$~$a_{18}$ in sections A(1,1), A(1,3), A(2,2) and A(3,1) are different, which means at least one same structure locates at different relative positions in two of the aforementioned sections. To be more specific, the amount of the sections satisfying a sum of x and y is even is less than the factorial of 18 (18!). By a well-known method of random calculation, such as Monte-Carlo Simulation, the pattern structures can be arranged variously in sections. Similarly, when section A(x,y) has an odd sum of x and y, it comprises a plurality of pattern structures $b_1$~$b_{18}$ of the second group arranged variously in different sections. However, the arrangements of the pattern structures $b_1$~$b_{18}$ in these sections are different such that same pattern structures locate at different relative positions in different sections. In this embodiment, arrangements of pattern structures $b_1$~$b_{18}$ are different in sections A(2,1), A(1,2), A(2,3) and A(3,2) which means at least one same pattern structure in any two of the aforementioned sections locates at different relative positions in two sections. By a well-known method of random calculation, such as Monte-Carlo Simulation, the pattern structures can be arranged variously in sections. To be more specific, the amount of the sections satisfying a sum of x and y is odd is less than the factorial of 18 (18!). Thus, the arrangements of the sections are different from each other. Although the patterned interface 1011 has limited, predetermined, and different pattern structures repeatedly arranged in different sections as disclosed in the embodiment, at least one different characteristic can be found in any two neighboring pattern structures on the patterned interface 1011. Compared with pattern structure of one cycle, the efficiency of light extraction in the embodiment disclosed above is improved because the light emitted from the active layer 105 is uniformly spread to the patterned interface 1011.

Figure 2E:
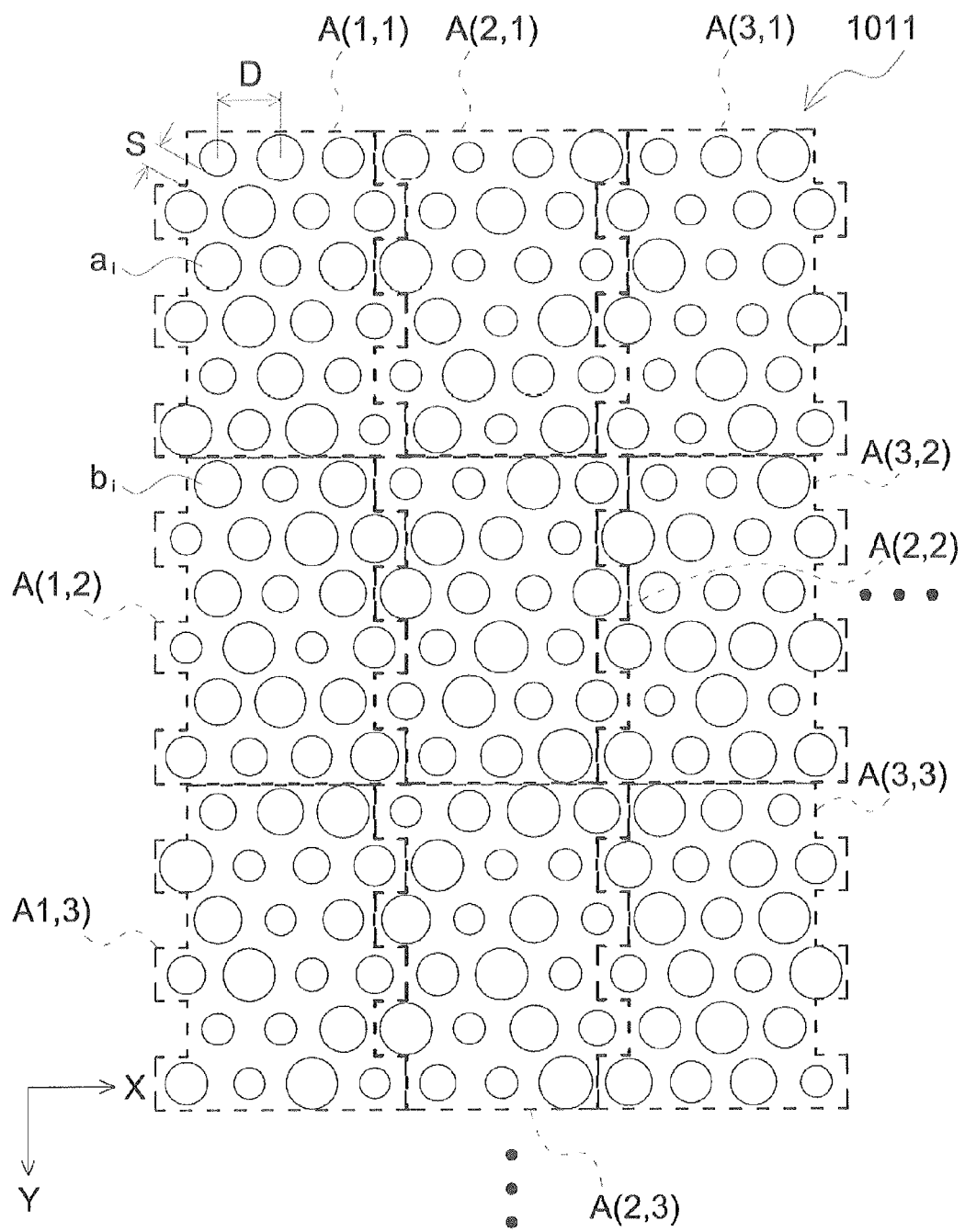

FIG. 2E further discloses a fifth embodiment of the patterned interface 1011 in FIG. 1 comprising a plurality of patterned sections arranged in an array wherein the location of each patterned section is defined as A(x,y), 1≤x≤m, 1≤y≤n wherein x and y are correspondingly represent the value of coordinate in horizontal and in vertical direction. The x,y,m, and n are positive integers while m and n are determined by the chip size of the light emitting device. A section A(x,y) having an even sum of x and y, such as sections A(1,1), A(1,3), A(2,2), A(3,1), and A(3,3) comprises a plurality of pattern structures a, of the first group. A section A(x,y) having an odd sum of x and y, such as A(2,1), A(1,2), A(2,3), and A(3,2) comprises a plurality of pattern structures $b_i$ of the second group. Thus, sections comprising multiple pattern structures $a_i$ of the first group and sections comprising multiple pattern structures $b_i$ of the second group are spaced apart from each other and/or abutted against each other so any two neighboring patterned structures on the patterned interface 1011 have at least one different characteristic not limited to size, shape, spacing, or other structure characteristics. To be more specific, A (1, 1) comprises twenty-one patterned structures $a_1 \sim a_{21}$ of circle top view with different diameters. The distance D between two geometric centers of two neighboring patterned structures is about 1~10 µm, and the closest spacing of the periphery between two neighboring patterned structures is not less than 0.1 µm and preferably between 0.1~5 µm. A (2, 1) also comprises twenty-one patterned structures $b_1 \sim b_{21}$ of circle shape but different diameter wherein a distance D is between two geometric centers of two neighboring patterned structures. The closest spacing of the periphery between two neighboring patterned structures is not less than 0.1 µm and preferably between 0.1~5 µm. The feature sizes (diameter) $r_1 \sim r_{21}$ of $a_1 \sim a_{21}$ satisfy the below equation:

$$r_i = r_m + (2i - 2) * \frac{(r_M - r_m)}{2n - 1}, i = 1 \sim n;$$

diameters of $b_1 \sim b_{21}$, which are also represented as $R_1 \sim R_{21}$ satisfy the below equation:

$$R_i = r_m + (2i - 1) * \frac{(r_M - r_m)}{2n - 1}, i = 1 \sim n;$$

wherein the $r_m$ and $r_M$ respectively represent the smallest diameter and the largest diameter of patterned structures $a_1 \sim a_{21}$ and patterned structures $b_1 \sim b_{21}$. The 2n represents the total number of the patterned structures $a_1 \sim a_{21}$ and $b_1 \sim b_{21}$, which equals to forty-two in this embodiment, i.e. 2n=42. For example, when $r_m$ and $r_M$ are 0.9 µm and 5.0 µm, $r_1 \sim r_{21}$ are 0.9, 1.1, 1.3, . . . , 4.7, 4.9 µm, wherein $r_1 = r_m$ and the shortest distance between periphery of two neighboring patterned structures is an integer multiple of a predetermined value; $R_1 \sim R_{21}$ are 1.0, 1.2, 1.4 . . . , 4.8, 5.0 µm wherein $R_S = r_M$ and the shortest distance between periphery of two neighboring patterned structures is an integer multiple of a predetermined value.

In this embodiment, any one of the sections A(x,y) satisfying a sum of x and y is even comprises a plurality of pattern structures $a_1 \sim a_{21}$ of the first group. However, the arrangements of the pattern structures $a_1 \sim a_{21}$ in these sections are different from each other such that the same pattern structures locate at different relative positions in different sections. In this embodiment, arrangements of pattern structures $a_1 \sim a_{21}$ in sections A(1,1), A(1,3), A(2,2) and A(3,1) are different, which means at least one same structure locates at different relative positions in two of the aforementioned sections. To be more specific, the amount of the sections satisfying a sum of x and y is even is less than the factorial of 21 (21!). By a well-known method of random calculation, such as Monte-Carlo Simulation, the pattern structures can be arranged variously in sections. Similarly, when section A(x,y) has an odd sum of x and y, it comprises a plurality of pattern structures $b_1 \sim b_{21}$ of second group. However, the arrangements of the pattern structures $b_1 \sim b_{21}$ in these sections are different such that same pattern structures locate at different relative positions in different sections. In this embodiment, arrangements of pattern structures $b_1 \sim b_{21}$ are different in sections A(2,1), A(1,2), A(2,3) and A(3,2) which means at least one same pattern structure in any two of the aforementioned sections locates at different relative positions in two sections. The arrangements can be realized by a well-known method of random calculation, such as Monte-Carlo Simulation to be different from each other. To be more specific, the amount of the sections satisfying a sum of x and y is odd is less than the factorial of 21 (21!). Thus, the arrangements of the sections are different from each other. Although the patterned interface 1011 has limited, predetermined, and different pattern structures repeatedly arranged in different sections as disclosed in the embodiment, at least one different characteristic can be found in any two neighboring pattern structures on the patterned interface 1011. Compared with pattern structure of one cycle, the efficiency of light extraction in the embodiment disclosed above is improved because the light emitted from the active layer 105 is uniformly spread to the patterned interface 1011.

Figure 3A:
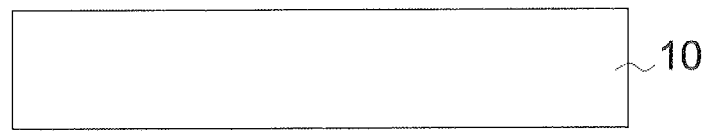
FIGS. 3A-3D show a process flow of the manufacturing method of the light emitting device in accordance with the first embodiment of the present disclosure.
Figure 3B:
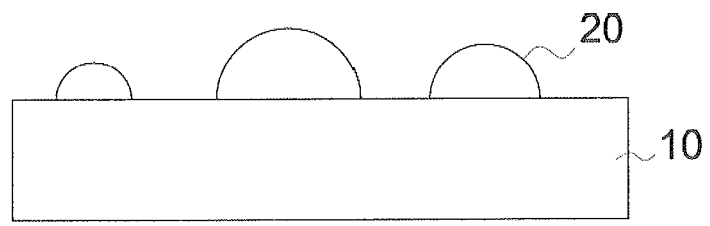
Figure 3C:
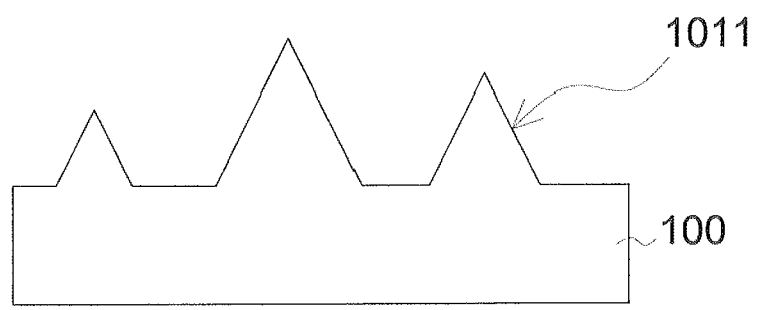
Figure 3D:
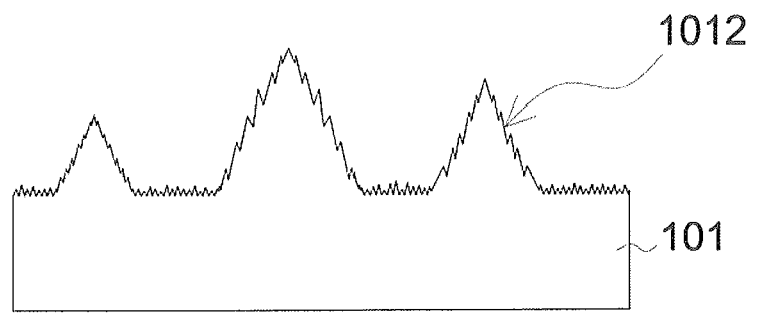

FIGS. 3A~3D disclose a manufacturing method in accordance with the patterned interface 1011 disclosed in FIGS. 2A~2E comprising forming a mask designed to have patterns in accordance patterns of FIGS. 2A~2E and lithography process such as exposing with traditional photo resistance and development to form a patterned photo resistance layer 20 on a growth substrate 10 as shown in FIG. 3B. Then, transferring the pattern of the patterned photo resistance layer 20 to the growth substrate 10 by a dry etching process to form a substrate 100 having a patterned interface 1011 as shown in FIG. 3C. In another embodiment of the present disclosure, a wet etching process is performed on a whole surface of the patterned interface 1011 in FIG. 3C to form a patterned interface 1012 having micro-roughed structures. The micro-roughed structure is a micro-structure substantially formed along the topography of the patterned interface 1011. In that case, the roughness of the micro-roughed structure is not larger than the roughness of the patterned interface 1012 so the emitted light can be scattered and the efficiency of light extraction is improved. The patterned interface disclosed in the embodiments of this disclosure is available for mass production and keep less variation of products between substrate to substrate or wafer to wafer. In comparison with traditional process of random roughness, disclosed embodiments provide more stable and controllable quality with less variation of products and better reproducibility of products.

Figure 4A:
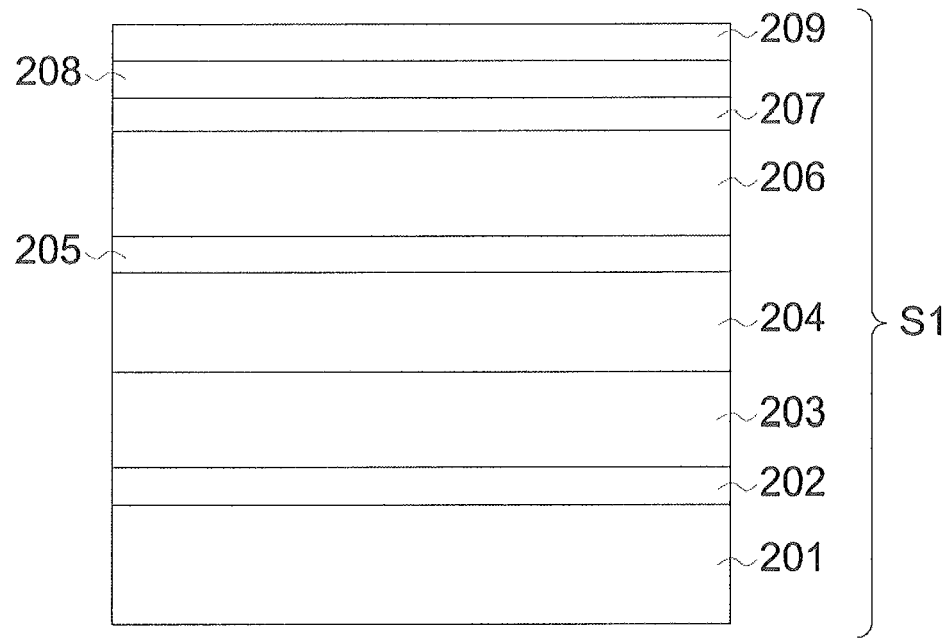
FIGS. 4A-4D show a process flow of the manufacturing method of the light emitting device in accordance with the second embodiment of the present disclosure.
Figure 4B:
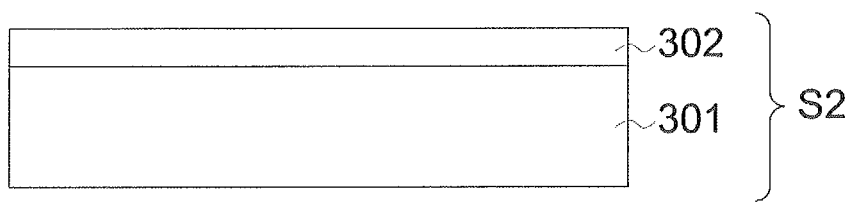
Figure 4C:
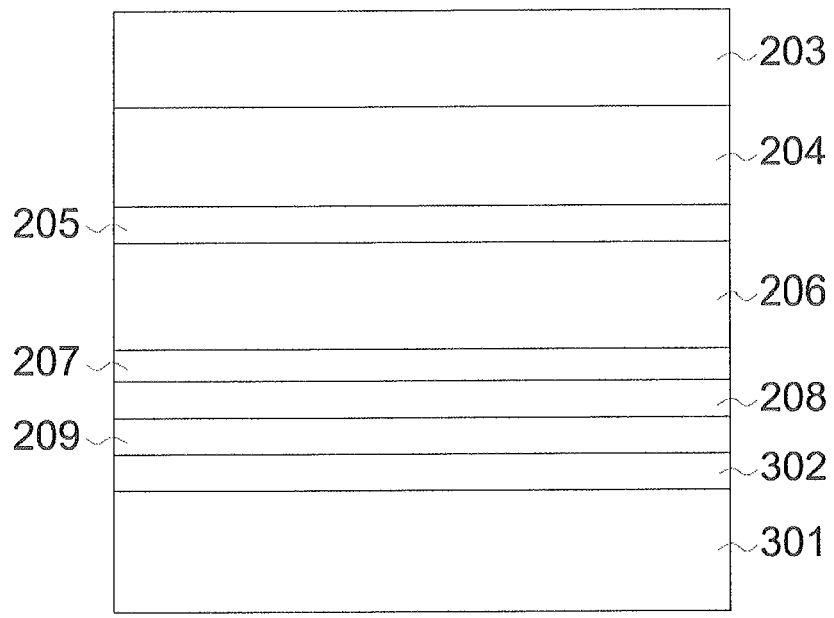
Figure 4D:
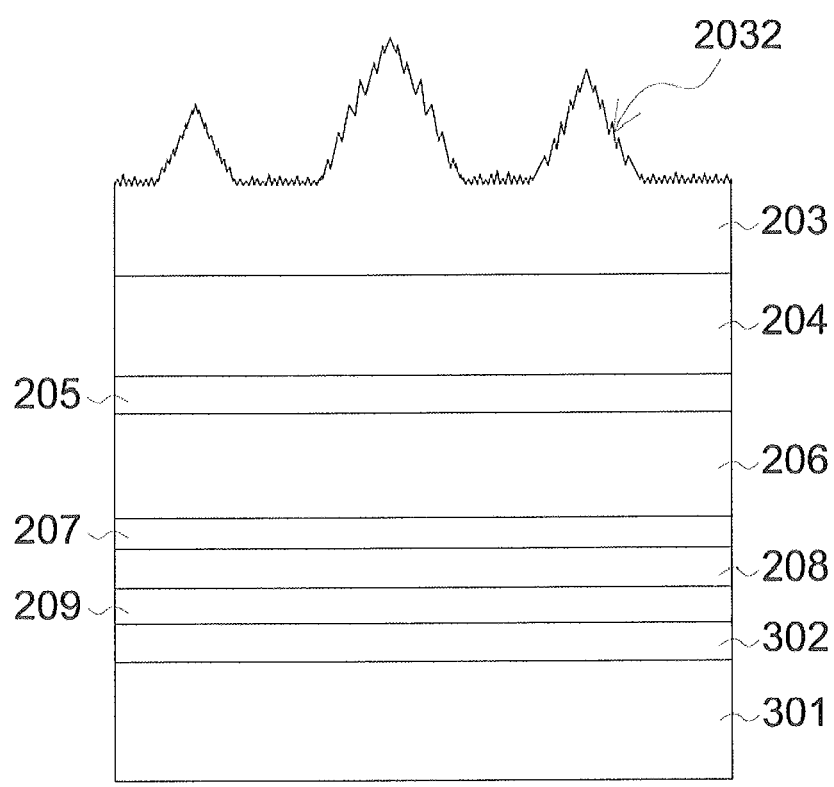

FIGS. 4A~4D disclose a light emitting device and its manufacturing method in accordance with the second embodiment. The manufacturing method comprises providing a first stack structure S1 which comprises providing a growth substrate 201, epitaxially growing an un-doped semiconductor layer 202 on a growth substrate 201, epitaxially growing a first contact layer 203 doped with first impurities on the un-doped semiconductor layer 202, epitaxially growing a first cladding layer 204 doped with first impurities on the first contact layer 203, epitaxially forming an active layer 205 on the first cladding layer 204 wherein the active layer 205 can be driven to emit a light having a first dominant wavelength, epitaxially growing a second cladding layer 206 doped with second impurities on the active layer 205, epitaxially growing a second contact layer 207 doped with a second impurity on the second cladding layer 206, forming a reflective layer 208 on the second contact layer 207 and forming an Ohmic contact with the second contact layer 207, forming a first connection layer 209 on the reflective layer 208 to finish the first stack structure S1 as shown in FIG. 4A. The reflective layer 208 comprises materials having a reflectance higher than 80% in accordance with the light emitted from the active layer, such as metal, dielectric material, and the combination thereof. Then, providing a second stack structure comprising providing a carrier 301 and forming a second connection layer 302 on the carrier 301 to finish the second stack structure S2 as shown in FIG. 4B. After finishing the first stack structure S1 and the second stack structure S2, connecting the first connection layer 209 and the second connection layer 302 with a connection step to combine the first stack structure S1 and the second stack structure S2. In the embodiment, the connection step is performed by a process of thermo-compression bonding under 400° C. After connecting, removing the growth substrate 201 and the un-doped semiconductor layer 202 to expose the first contact layer 203 as shown in FIG. 4C. Then, forming a patterned interface 2032 on the surface of the first contact layer 203. The patterned interface 2032 and its manufacturing method are as same as the above description depicted in FIG. 1, FIGS. 2A~2D, and FIGS. 3A~3D.

Patterned interfaces disclosed in the above embodiments are not restricted to be formed on interfaces between two specific structures or on surface of a specific structure. Such that, forming a patterned interface disclosed in the above embodiments on an interface between any two structures or on a surface of any structure without departing from the scope or spirit of the disclosure. Patterned interfaces disclosed in embodiments above are not restricted to be formed on all interfaces or on all surfaces. Such that, patterned interface can also be formed on part of the interfaces or surfaces.

In the above embodiments, the materials of the un-doped semiconductor layer, first contact layer, first cladding layer, second cladding layer, second contact layer and the active layer comprise III-V materials, such as $Al_pGa_qIn_{(1-p-q)}P$ or $Al_xIn_yGa_{(1-x-y)}N$ $0 \leq p, q, x, y \leq 1$ and the p,q,x,and y are positive numbers with (p+q)≤1 and (x+y)≤1. The first impurity is an n-type impurity, such as Si, or a p-type impurity, such as Mg or Zn. The second impurity is an impurity having an opposite conductive type compared with the first impurity. The current spreading layer comprises conductive metal oxide, such as ITO and ZnO or conductive semiconductor layer such as the semiconductor layer having a high doping concentration phosphides or nitride compound. The material of the growth substrate can be transparent material, such as GaP, sapphire, SiC, GaN, Si, and AlN. The material of the first connection layer or the second connection layer can be decided by the application, such as conductive materials and insulating materials respectively adapted to vertical and horizontal light emitting devices; wherein the conductive materials comprise semiconductor layers, transparent conductive oxide, metal, and metal alloy and the insulating materials comprise macromolecule material and dielectric material.

In the above embodiments, based on the requirement of the application, the material of the carrier can be conductive material or a material having conductivity higher than the growth substrate, transparent material or a material having a higher transparency than the growth substrate in accordance with the light emitted from the active layer, and thermal conducting material or a material having a higher thermal conductivity than the growth substrate. The conductive material of the carrier comprises semiconductor, transparent conductive oxide, metal, and metal alloy. The transparent material of the carrier comprises GaN, sapphire, SiC, GaN, or AlN. The thermal conducting material of the carrier comprises semiconductor such as Si or ZnO, carbon based material such as diamond, diamond like carbon (DLC), or graphite, metal or metal alloy.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

The invention claimed is:

1. A light-emitting device, comprising:
a substrate comprising a first section and a second section, each section having a first plurality of patterned structures formed therein, wherein at least two patterned structures present in each section have a pattern, shape or arrangement repeated between the sections, and wherein any two neighboring patterned structures are different from each other.

2. The light emitting device of claim 1, wherein the first plurality of patterned structures has substantially the same shape with different feature sizes.

3. The light-emitting device of claim 1, wherein the first plurality of patterned structures is arranged in a configuration of a regular polygon or a circle.

4. The light-emitting device of claim 2, wherein the feature sizes are between 0.5 to 10 μm.

5. The light-emitting device of claim 1, wherein the any two neighboring patterned structures are substantially spaced apart from each other with equal-distance between geometric centers thereof and have different feature sizes.

6. The light-emitting device of claim 2, wherein the first plurality of patterned structures having different sizes satisfying the below equation:

$$r_i = r_m + (2i-2) * \frac{(r_M - r_m)}{2n-1}, i = 1 \sim n;$$

wherein the rm and rM respectively represent the smallest and biggest feature sizes of the plurality of predetermined patterned structures, 2*n is the amount of the plurality of predetermined patterned structures.

7. The light-emitting device of claim 1, wherein the first plurality of patterned structures comprises cones or pyramids.

8. The light-emitting device of claim 1, wherein the substrate further comprises a third section comprising a second plurality of patterned structures different from and the first plurality of patterned structure in the first or second section.

9. The light-emitting device of claim 1, wherein the first plurality of patterned structures in the first section, the second sections, or both are is arranged in a two dimensional array.

10. The light-emitting device of claim 1, further comprising an epitaxial stack formed on the first and the second section.

11. The light-emitting device of claim 1, further comprising a connection layer and a reflective layer formed on the substrate.

12. A manufacturing method of a light emitting device comprising steps of:
- providing a substrate;
- generating a random pattern arrangement according to a simulation calculation;
- forming a mask having the random pattern arrangement on the substrate; and
- removing part of the substrate such that the substrate has the random pattern arrangement on the substrate.

13. The method of claim 12, wherein the simulation calculation comprises Monte-Carlo Simulation.

14. The method to of claim 12, further comprising removing the mask.

15. The method to of claim 12, further comprising epitaxially forming an epitaxial stack on the substrate.

16. The method of claim 12, wherein the random pattern arrangement is composed of a plurality of different pattern structures, wherein the plurality of different pattern structures are repeatedly arranged with different arrangements on different sections of the substrate such that any two neighboring structures are different from each other.

17. A light-emitting device, comprising:
- a substrate having a first section and a second section;
- a first group of patterned structures formed in the first section; and
- a second group of patterned structures formed in the second section, wherein the first and second group of patterned structures commonly comprise a group of pattered structures which is arranged in the first and second sections in different configurations, wherein any two neighboring patterned structures are different from each other within or between each section.

* * * * *